(12) United States Patent
Kimura et al.

(10) Patent No.: US 12,217,983 B2
(45) Date of Patent: Feb. 4, 2025

(54) SUBSTRATE PROCESSING APPARATUS

(71) Applicant: J.E.T. CO., LTD., Okayama (JP)

(72) Inventors: Atsuo Kimura, Okayama (JP); Hirofumi Shomori, Okayama (JP)

(73) Assignee: J.E.T. CO., LTD., Asakuchi-gun (JP)

( * ) Notice: Subject to any disclaimer, the term of this patent is extended or adjusted under 35 U.S.C. 154(b) by 259 days.

(21) Appl. No.: 17/792,398

(22) PCT Filed: Nov. 5, 2020

(86) PCT No.: PCT/JP2020/041322
§ 371 (c)(1),
(2) Date: Jul. 12, 2022

(87) PCT Pub. No.: WO2021/149324
PCT Pub. Date: Jul. 29, 2021

(65) Prior Publication Data
US 2023/0274956 A1 Aug. 31, 2023

(30) Foreign Application Priority Data
Jan. 20, 2020 (JP) ................. 2020-006856

(51) Int. Cl.
*H01L 21/67* (2006.01)
*H01L 21/306* (2006.01)
(52) U.S. Cl.
CPC .... *H01L 21/6715* (2013.01); *H01L 21/30604* (2013.01)
(58) Field of Classification Search
None
See application file for complete search history.

(56) References Cited

U.S. PATENT DOCUMENTS

2008/0017313 A1   1/2008   Kim
2019/0259639 A1   8/2019   Satoshi

FOREIGN PATENT DOCUMENTS

JP   2005296868 A   10/2005
JP   2006344792 A   12/2006
(Continued)

OTHER PUBLICATIONS

JP 20100082558 translation. Microbubble Supplying Apparatus and Liquid Treatment Unit, Yasunaga (Year: 2008).*

*Primary Examiner* — Cristi J Tate-Sims
(74) *Attorney, Agent, or Firm* — Muncy, Geissler, Olds & Lowe, P.C.

(57) ABSTRACT

A substrate processing apparatus according to the present invention includes: a processing tank that stores a processing liquid and accommodates a plurality of substrates; a bubble forming section that includes a plurality of bubble pipes, wherein each of the plurality of bubble pipes is divided into a tubular first discharge unit and a tubular second discharge unit that is coaxial with the first discharge unit, wherein one end on a divided side of the first discharge unit and one end on the divided side of the second discharge unit is closed and a plurality of gas discharge holes are formed on the first and second discharge units, and the plurality of bubble pipes are disposed at an interval in a horizontal direction orthogonal to the arrangement direction below the plurality of substrates to be accommodated in the processing tank; and a plurality of flow rate adjustment units that are provided corresponding to each of the first discharge units and each of the second discharge units and independently adjust flow rate of an inert gas.

4 Claims, 6 Drawing Sheets

(56) References Cited

FOREIGN PATENT DOCUMENTS

| | | | |
|---|---|---|---|
| JP | 2007324567 | A | 12/2007 |
| JP | 2009098270 | A | 5/2009 |
| JP | 2010082558 | A | 4/2010 |
| JP | 2017069529 | A | 4/2017 |
| JP | 2018174257 | A | 11/2018 |
| JP | 2019050349 | A | 3/2019 |
| JP | 2019145686 | A | 8/2019 |

* cited by examiner

SUBSTRATE PROCESSING APPARATUS

TECHNICAL FIELD

The present invention relates to a substrate processing apparatus such as a semiconductor wafer.

BACKGROUND ART

There is a substrate processing apparatus in which a substrate such as a semiconductor wafer is immersed in a phosphoric acid aqueous solution stored in a processing tank, and, for example, a silicon nitride film or the like formed on a substrate surface is removed by wet etching. As a substrate processing apparatus that performs such wet etching, a batch-type apparatus that performs etching processing by immersing a plurality of substrates into a processing liquid such as a phosphoric acid aqueous solution in the processing tank in a state where the substrates are raised and held at a predetermined pitch is known. In a batch-type substrate processing apparatus, the pitch for holding a plurality of substrates is often made small in order to downsize the apparatus.

A substrate processing apparatus that promotes an upward flow of a processing liquid by forming bubbles of an inert gas (for example, nitrogen gas) in the processing liquid within the processing tank is known (see, for example, PTL 1). In the substrate processing apparatus of PTL 1, in order to form bubbles of an inert gas in a processing liquid including a phosphoric acid aqueous solution, a plurality of gas nozzles are arranged below the plurality of substrates in the processing tank, and the inert gas is discharged from each gas nozzle, thereby generating the upward flow in the processing liquid within the processing tank.

CITATION LIST

Patent Literature

PTL 1: JP 2019-50349 A

SUMMARY OF THE INVENTION

Technical Problem

In a batch-type substrate processing apparatus that holds a plurality of substrates in a processing liquid at a small pitch, it is useful to promote the upward flow of the processing liquid by forming bubbles in the processing liquid. However, even if the bubbles are formed in the processing liquid within the processing tank, processing uniformity of each substrate surface and processing uniformity between the substrates are not sufficient, and improvement is desired. In particular, when processing is performed using a processing liquid having a high viscosity such as a phosphoric acid aqueous solution, the processing liquid is difficult to flow between the substrates, so that the processing uniformity is difficult to obtain and further improvement is desired.

The present invention has been made in view of the above circumstances, and an object of the present invention is to provide a substrate processing apparatus capable of improving processing uniformity of a substrate by bubbles of an inert gas formed in a processing liquid.

Solution to Problem

A substrate processing apparatus according to the present invention includes: a processing tank that stores a processing liquid and accommodates a plurality of substrates arranged at a predetermined pitch in a standing state; a bubble forming section that includes a plurality of bubble pipes, wherein each of the plurality of bubble pipes is divided into a tubular first discharge unit that extends in an arrangement direction of the plurality of substrates and a tubular second discharge unit that is coaxial with the first discharge unit and extends in the arrangement direction within an arrangement range where the plurality of substrates are arranged, wherein one end on a divided side of the first discharge unit and one end on the divided side of the second discharge unit is closed and a plurality of gas discharge holes are formed on the first discharge unit and the second discharge unit along the arrangement direction, and the plurality of bubble pipes are disposed at an interval in a horizontal direction orthogonal to the arrangement direction below the plurality of substrates to be accommodated in the processing tank; and a plurality of flow rate adjustment units that are provided corresponding to each of the first discharge units and each of the second discharge units and independently adjust flow rate of an inert gas with respect to the corresponding first discharge units or second discharge units.

A substrate processing apparatus according to the present invention includes: a processing tank that stores a processing liquid and accommodates a plurality of substrates arranged at a predetermined pitch in a standing state; a liquid supply pipe that is disposed below the plurality of substrates to be accommodated in the processing tank and has a plurality of liquid discharge holes which are formed in an arrangement direction of the plurality of substrates and discharge the processing liquid downward inward and downward outward; and a bubble pipe that is disposed below the plurality of substrates to be accommodated in the processing tank and has a plurality of gas discharge holes which are formed in the arrangement direction and discharge an inert gas obliquely downward to form bubbles of the inert gas in the processing liquid.

Advantageous Effects of the Invention

According to the substrate processing apparatus of the present invention, each of the plurality of bubble pipes is divided into the first discharge unit and the second discharge unit within the arrangement range of the plurality of substrates, and the flow rate of inert gas with respect to each of the bubble pipes is independently adjusted by the plurality of flow rate adjustment units, so that the processing uniformity of the substrates can be further improved by the bubbles of the inert gas formed in the processing liquid.

According to the substrate processing apparatus of the present invention, since the processing liquid is discharged downward inward and downward outward from the liquid supply pipe, and the bubbles of the inert gas are discharged downward inward from the bubble pipe, the bubbles of the inert gas can be effectively formed in the processing liquid and the processing uniformity of the substrate can be further improved.

DESCRIPTION OF EMBODIMENTS

Figure 1:
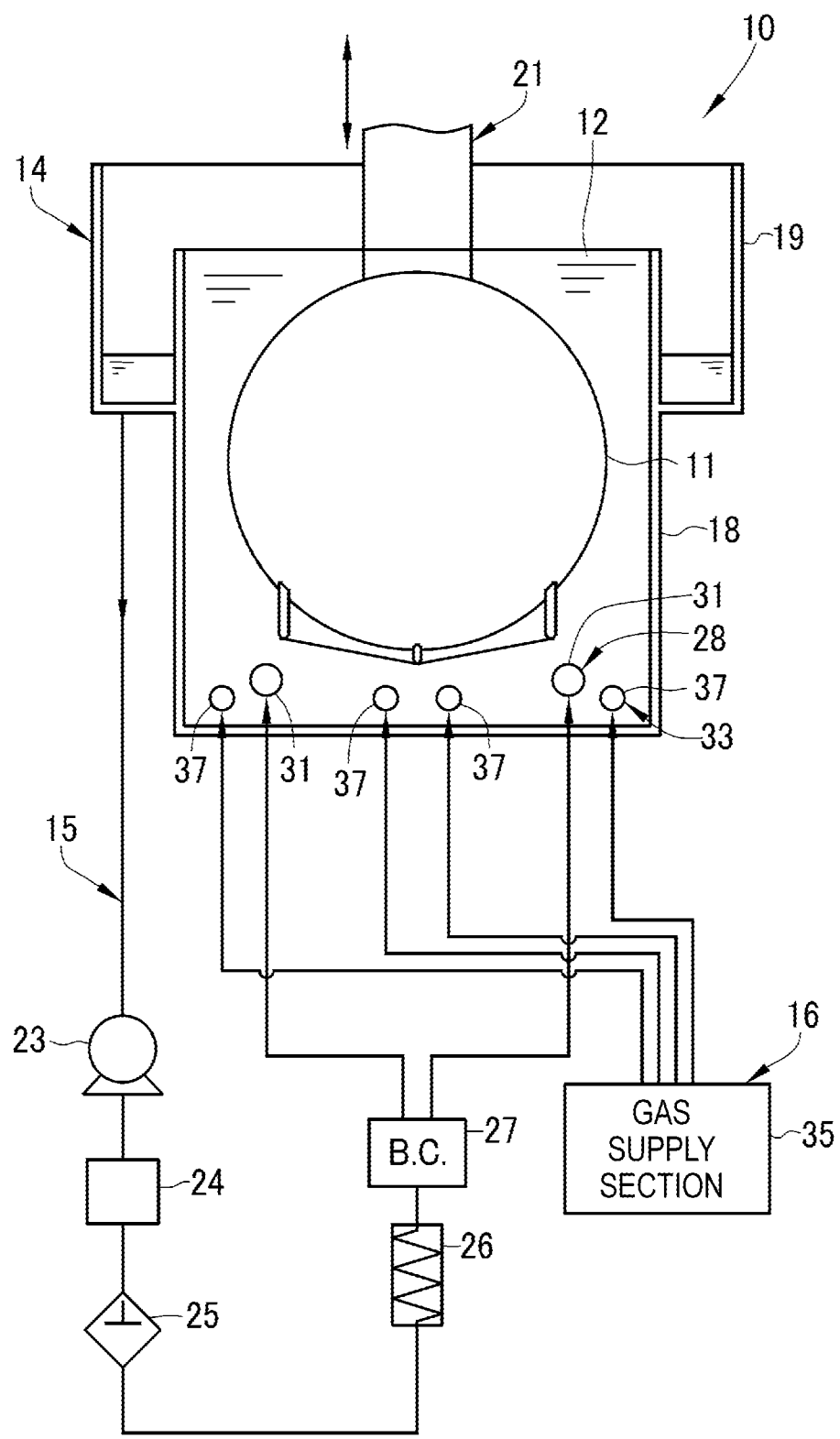
FIG. 1 A block diagram that illustrates a configuration of a substrate processing apparatus.

In FIG. 1, a substrate processing apparatus 10 removes a thin film formed on a substrate 11 with a processing liquid 12. In this example, the substrate 11 is a silicon wafer (a semiconductor substrate), and etching processing of selectively removing (etching) a silicon nitride film of a silicon oxide film ($SiO_2$ film) and the silicon nitride film ($Si_3N_4$ film) formed on the surface of the substrate 11 using the processing liquid 12 is performed. The processing liquid 12 is a phosphoric acid aqueous solution in which phosphoric acid ($H_3PO_4$) is dissolved in pure water (deionized water).

The substrate processing apparatus 10 includes a tank portion 14, a circulation mechanism 15, and a bubble generation mechanism 16. The tank portion 14 includes a box-shaped processing tank 18 and an outer tank 19 integrally provided on the upper outer side of the processing tank 18. The processing tank 18 stores the processing liquid 12. The processing liquid 12 is supplied to the processing tank 18 by the circulation mechanism 15. The outer tank 19 receives the processing liquid 12 overflowing from the processing tank 18. The processing liquid 12 overflowing into the outer tank 19 is returned to the processing tank 18 via the circulation mechanism 15. Additionally, the substrate processing apparatus 10 is provided with a lid member (not illustrated) that opens and closes the upper portion of the tank portion 14.

The substrate processing apparatus 10 is of a batch type and accommodates the plurality of substrates 11 held by a holder 21 in the processing tank 18, and these substrates 11 are immersed in the processing liquid 12. The substrates 11 each are arranged in a direction perpendicular to the paper surface and held by the holder 21 in a standing posture, that is, a posture in which the substrate surfaces (front surfaces and back surfaces) are along a vertical direction. As illustrated in FIG. 1, the holder 21 moves between a lowered position where each substrate 11 is immersed in the processing liquid 12 within the processing tank 18 and a raised position where the substrates 11 are raised from the lowered position and is pulled up from the processing liquid 12.

The circulation mechanism 15 includes a circulation pump 23, a damper 24, a filter 25, a heater 26, a bubble cutter 27, and a liquid supply pipe portion 28. The circulation pump 23 is connected to the outer tank 19, and the damper 24, the filter 25, the heater 26, the bubble cutter 27, and the liquid supply pipe portion 28 are connected in order from the circulation pump 23. The circulation pump 23, the damper 24, the filter 25, the heater 26, and the bubble cutter 27 are disposed outside the tank portion 14. The liquid supply pipe portion 28 includes two liquid supply pipes 31. These two liquid supply pipes 31 are arranged at the same height, that is, on the same horizontal plane at the bottom of the processing tank 18, and are provided below the holder 21 at the lowered position, that is, at a position lower than the substrates 11 accommodated in the processing tank 18.

The circulation pump 23 sends the processing liquid 12 in the outer tank 19 toward the liquid supply pipes 31. The damper 24 temporarily stores an appropriate amount of processing liquid 12 to suppress a flow rate fluctuation of the processing liquid 12 in the circulation mechanism 15, and the filter 25 removes particles and the like in the processing liquid 12. The heater 26 heats the processing liquid 12 to be supplied to the processing tank 18 to a boiling point or higher, and the bubble cutter 27 removes bubbles in the processing liquid 12 to be supplied. The liquid supply pipes 31 are provided with a plurality of liquid discharge holes 31a and 31b (see FIG. 3), and the processing liquid 12 from the circulation mechanism 15 is discharged into the processing tank 18 via the liquid discharge holes 31a and 31b. The processing liquid 12 in the processing tank 18 is, for example, about 150° C. to 165° C.

By the circulation mechanism 15 configured as described above, the processing liquid 12 overflowing from the processing tank 18 to the outer tank 19 is filtered, heated, and returned to the processing tank 18. Further, the circulation mechanism 15 is provided with a pure water supply mechanism (not illustrated) for adding water to the processing liquid 12 that circulates. The pure water supply mechanism keeps the concentration of phosphoric acid in the processing liquid 12 within the processing tank 18 constant by adjusting the amount of water added to the processing liquid 12.

The bubble generation mechanism 16 includes a bubble forming section 33 and a gas supply section 35, and the bubble forming section 33 includes a plurality of (four in this example) bubble pipes 37 provided at the bottom of the processing tank 18. The bubble pipes 37 are provided with a plurality of gas discharge holes 37a (see FIG. 3), and bubbles are formed in the processing liquid 12 by discharging nitrogen ($N_2$) as an inert gas from the gas discharge holes 37a. In this manner, the bubble generation mechanism 16 increases fluidity of the processing liquid 12 by forming the bubbles of nitrogen gas in the processing liquid 12, and rise of bubbles promotes the upward flow of the processing liquid 12 particularly between the substrates 11 and between the substrates 11 and support plates 44 (see FIG. 2). Each of the bubble pipes 37 is disposed at the same height at the bottom of the processing tank 18, is disposed below the holder 21 at the lowered position, and is provided at a position lower than the substrates 11 accommodated in the processing tank 18, similarly to the liquid supply pipes 31.

The gas supply section 35 supplies the nitrogen gas to the bubble forming section 33. As will be described in detail later, each bubble pipe 37 in the bubble forming section 33 is divided into a first discharge unit 41 and a second discharge unit 42 (see FIG. 3), and the gas supply section 35 can independently adjust the flow rate of the nitrogen gas with respect to the first discharge unit 41 and the second discharge unit 42 of each bubble pipe 37.

Figure 2:
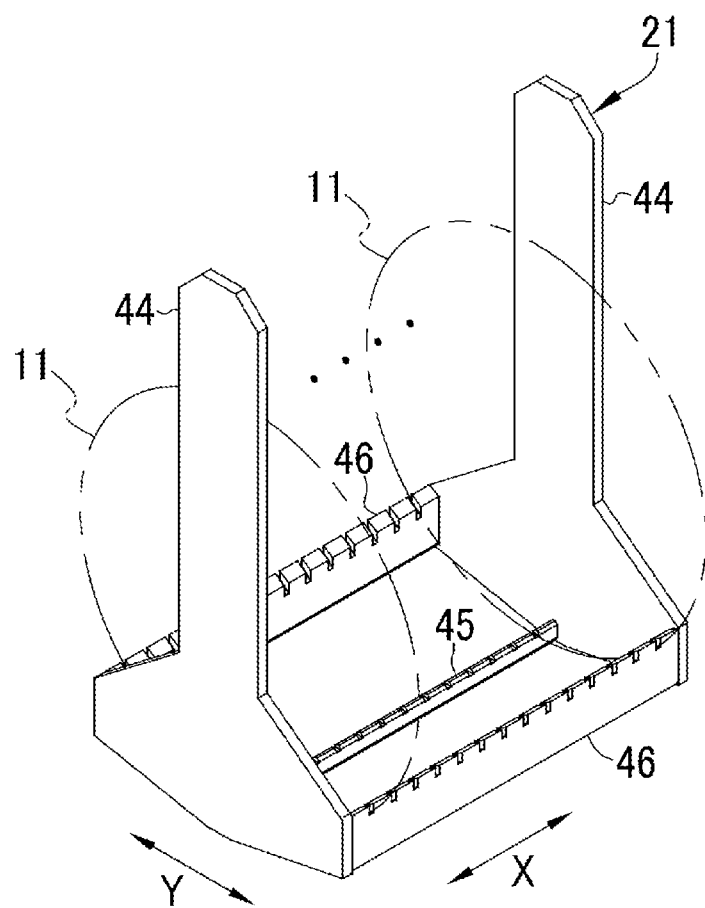
FIG. 2 A perspective view that illustrates a configuration of a holder.

As illustrated in FIG. 2, the holder 21 includes a pair of support plates 44, a bottom bar 45, and a pair of side bars 46. The pair of support plates 44 is provided apart from each other in the arrangement direction of the substrates 11 (hereinafter, an arrow X direction referred to as a substrate arrangement direction). Both ends of the bottom bar 45 and the pair of side bars 46 are fixed to the pair of support plates 44 at predetermined intervals in a width direction (an arrow Y direction) that is a horizontal direction orthogonal to the substrate arrangement direction. In the bottom bar 45 and the pair of side bars 46, a plurality of grooves are formed at a constant pitch in the substrate arrangement direction. Additionally, in FIG. 2, for convenience of illustration, the number of grooves is smaller than the actual number of grooves, but in this example, the grooves are actually provided so as to hold 50 pieces of substrates 11 in the holder 21.

In the holder 21, the substrates 11 are held in a state where the lowermost peripheral edges of the substrates enter the groove of the bottom bar 45, and the peripheral edges on both sides of the lower half enter the corresponding grooves of the pair of side bars 46. Accordingly, the holder 21 holds each substrate 11 in a standing posture at three points, and arranges and holds the plurality of substrates 11 at predetermined intervals in a state where the front surfaces face each other, the back surfaces face each other, or the front surfaces and the back surfaces face each other.

The holder 21 configured as described above has an opening at the bottom, and is configured not to interfere entry of the processing liquid 12 and the bubbles from below between the held substrates 11 and between the substrates 11 and the support plates 44.

Figure 3:
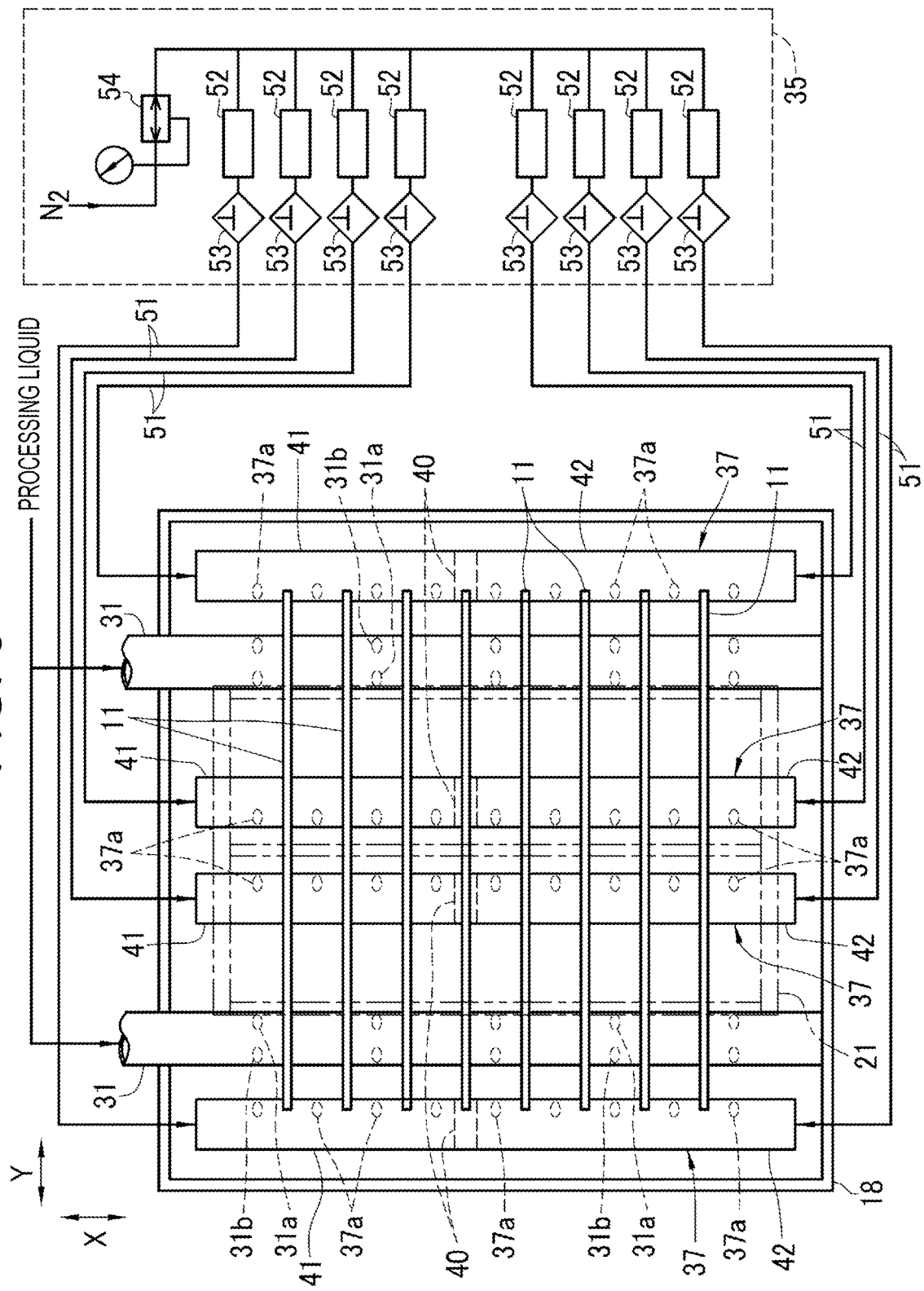
FIG. 3 An explanatory view that schematically illustrates a layout of a liquid supply pipe and a bubble pipe.

FIG. 3 schematically illustrates a layout in the processing tank 18 as viewed from above. Further, in FIG. 3, the number of the substrates 11 is reduced and illustration of some members is omitted in order to simplify the drawing. The layout of the liquid supply pipes 31 and the bubble pipes 37 is line-symmetric with a center line parallel to the substrate arrangement direction passing through the center of the substrates 11 as a symmetry axis. As described above, the layout of the liquid supply pipes 31 and the bubble pipes 37 is preferably line-symmetric with a straight line parallel to the center line along the substrate arrangement direction passing through the center of the substrates 11 as the symmetry axis. In addition, the liquid supply pipes 31 and the bubble pipes 37 have a tubular shape extending in the substrate arrangement direction, that is, a circular tubular shape having a constant pipe diameter in this example.

In the width direction, the two liquid supply pipes 31 are disposed apart from each other at a predetermined distance in the width direction. In this example, the liquid supply pipes 31 are arranged immediately below the vicinity of the end portions in the width direction of the substrates 11, and the distance from the position in the width direction of the vertical line passing through the center of the substrates 11 (hereinafter, referred to as a widthwise center) accommodated in the processing tank 18 to the liquid supply pipes 31 is smaller than the radius of the substrates 11.

Of the four bubble pipes 37, two bubble pipes 37 are disposed at positions close to the widthwise center and are provided close to each other. Each of the other two bubble pipes 37 is disposed outside the liquid supply pipes 31 in proximity to the liquid supply pipe 31. Accordingly, the other two bubble pipes 37 are disposed immediately below the vicinity of the end portions in the width direction of the substrates 11.

Additionally, the inner side is closer to the widthwise center, and the outer side is farther from the widthwise center, and further, in the following description, when two bubble pipes 37 close to the widthwise center and the other two bubble pipes 37 are particularly distinguished, the former will be referred to as an inner bubble pipe 37, and the latter will be referred to as an outer bubble pipe 37.

The liquid supply pipes 31 are provided with a plurality of liquid discharge holes 31*a* and a plurality of liquid discharge holes 31*b* in a pipe wall portion below the liquid supply pipe. The liquid discharge holes 31*a* and 31*b* are linearly arranged at a predetermined pitch in the substrate arrangement direction. The liquid discharge holes 31*a* and 31*b* penetrate the pipe wall of the liquid supply pipes 31.

In this example, the liquid discharge holes 31*a* and the liquid discharge holes 31*b* are provided at a pitch twice the arrangement pitch of the substrates 11, and are arranged immediately below the gap between the two adjacent substrates 11 and between the substrates 11 and the support plates 44. Further, in the substrate arrangement direction, the positions of the liquid discharge holes 31*a* and 31*b* in the liquid supply pipe 31 and the positions of the liquid discharge holes 31*a* and 31*b* between the two liquid supply pipes 31 are the same. Accordingly, the liquid discharge holes 31*a* and 31*b* are not disposed immediately below a partial gap between the two adjacent substrates 11.

The liquid supply pipes 31 have a leading end (an end portion on the lower side in the drawing) that is closed, and have a base end (an end portion on the upper side in the drawing) connected to the bubble cutter 27 of the circulation mechanism 15. Accordingly, the processing liquid 12 is supplied into the liquid supply pipes 31 from the base end side by the circulation mechanism 15, and the supplied processing liquid 12 is discharged into the processing tank 18 from the liquid discharge holes 31*a* and 31*b*.

Bubble pipes 37 are divided into the first discharge unit 41 on one end side and the second discharge unit 42 on the other end side by a partition plate 40 provided between the one end and the other end. In other words, the insides of the first discharge unit 41 and the second discharge unit 42 are different spaces because they are not connected to each other. Such bubble pipes 37 have a structure in which the first discharge unit 41 and the second discharge unit 42 that are tubular are coaxially extended along the substrate arrangement direction.

In each bubble pipe 37, the plurality of gas discharge holes 37*a* are formed in the pipe wall portion of a lower half of the bubble pipe so as to form a linear row at a predetermined pitch in the substrate arrangement direction. The gas discharge holes 37*a* penetrate the pipe wall of the bubble pipes 37. The pitch at which the gas discharge holes 37*a* are arranged can be arbitrarily set, but is preferably the same as the arrangement pitch of the substrates 11; and as illustrated in the drawing, the gas discharge holes 37*a* of the respective bubble pipes 37 are preferably arranged between two adjacent substrates 11 and immediately below the gap between the substrates 11 and the support plates 44. Accordingly, the gas discharge holes 37*a* are preferably provided at the same pitch as the entire bubble pipes 37 without separating the first discharge unit 41 and the second discharge unit 42.

Further, the position of the partition plate 40 in the bubble pipes 37 in the substrate arrangement direction can be appropriately set, but it is preferable to set the position at substantially the center of the arrangement range in which the substrates 11 are arranged while avoiding the position of the gas discharge holes 37*a*. By providing the partition plate 40 at a position substantially in the center of the arrangement range of the substrates 11, the number of gas discharge holes 37*a* in one of the first discharge units 41 and the second discharge units 42 is not increased, and the difference in the discharge amount of nitrogen gas between the gas discharge holes 37*a* on the leading end (the end portion on the partition plate 40 side) side of the first discharge unit 41 or the second discharge unit 42 and the gas discharge holes 37*a* on the base end (the end portion on the side opposite to the partition plate 40) side can be reduced. Accordingly, this makes it easy to adjust the flow rate of the nitrogen gas with respect to the first discharge unit 41 and the second discharge unit 42. In this example, since the gas discharge holes 37*a* are provided at the center position of the arrangement range of the substrates 11, the position of the partition plate 40 is shifted from the position by the arrangement pitch of the substrates 11 toward one end side of the bubble pipes 37. Accordingly, the number of gas discharge holes 37*a* on the first discharge unit 41 side is merely smaller by one than the number on the second discharge unit 42 side. Additionally, the "substantially center" of the arrangement range of the substrates 11 means that the distance from the center position of the arrangement range is within a range of 3 times or less the arrangement pitch of the substrates 11.

The first discharge unit 41 and the second discharge unit 42 of each bubble pipe 37 are connected to the gas supply section 35 via supply pipes 51 independent from each other, and independently receive the supply of nitrogen gas from the gas supply section 35. The supply pipe 51 is connected to the base end side of each of the first discharge unit 41 and the second discharge unit 42.

The gas supply section 35 includes eight flow rate adjustment units 52 corresponding to the first discharge units 41 and the second discharge units 42 respectively provided in the four bubble pipes 37. In other words, one flow rate adjustment unit 52 is provided for one first discharge unit 41 or one second discharge unit 42, and the flow rate adjustment units are connected with the corresponding discharge units by the supply pipe 51. Each flow rate adjustment unit 52 is configured by a flow rate adjustment valve or the like capable of independently adjusting the flow rate. A filter 53 for removing foreign matters in the nitrogen gas is connected between the first discharge unit 41 as well as the second discharge unit 42 and the flow rate adjustment unit 52.

The flow rate adjustment unit 52 receives supply of the nitrogen gas from a gas supply source (not illustrated) via a pressure reducing regulator 54, adjusts the flow rate, and causes the nitrogen gas to flow to the corresponding first discharge unit 41 or second discharge unit 42. The flow rate adjustment unit 52 independently adjusts the flow rate of the nitrogen gas to each of the first discharge units 41 and each of the second discharge units 42.

By the way, even when the flow of the processing liquid 12 in the space in which the substrates 11 are arranged is made uniform or the bubbles of nitrogen gas are uniformly formed in the processing liquid 12, a uniform etching may not be obtained. This is caused by various factors such as the flow of the processing liquid 12 in the processing tank 18, and a decrease in an etching rate due to an increase in silica concentration of the processing liquid 12 while flowing between the substrates 11 or between the substrates 11 and the support plates 44.

By respectively dividing the four bubble pipes 37 arranged as described above into the first discharge unit 41 and the second discharge unit 42, the amount of bubbles of nitrogen gas supplied to the processing liquid 12 in the space in the range of the substrates 11 held by the holder 21 can be divided into two at approximately the position of the partition plate 40 in the substrate arrangement direction, and can be further divided approximately into six regions that are divided into three at the center portion and both sides in the width direction, so that they can be adjusted independently.

For example, the air bubble amount in the central region in the width direction of the range of the substrates 11 can be increased or decreased by adjusting the flow rate of the nitrogen gas with respect to the inner bubble pipe 37. It is possible to separately increase or decrease the amount of bubbles in the region on the first discharge unit 41 side and the region on the second discharge unit 42 side of the inner bubble pipe 37. Further, by adjusting the flow rate of the nitrogen gas with respect to the outer bubble pipe 37, the air bubble amount in one or both regions outside the center of the range of the substrates 11 in the width direction can be increased or decreased, and also in this case, the amount of bubbles in the region on the first discharge unit 41 side and the amount of bubbles in the region on the second discharge unit 42 side can be separately increased or decreased.

The flow rate of the nitrogen gas to the first discharge unit 41 and each second discharge unit 42 (a set value of each flow rate adjustment unit 52) is determined in advance based on, for example, an experiment or the like in consideration of the distribution of the flow of the processing liquid 12 in the processing tank 18, the decrease in the etching rate due to the local increase in the silica concentration of the processing liquid 12, and the like, so as to reduce the difference in the etching amount in each part of the plurality of substrates 11 held in each holder 21.

Figure 4:
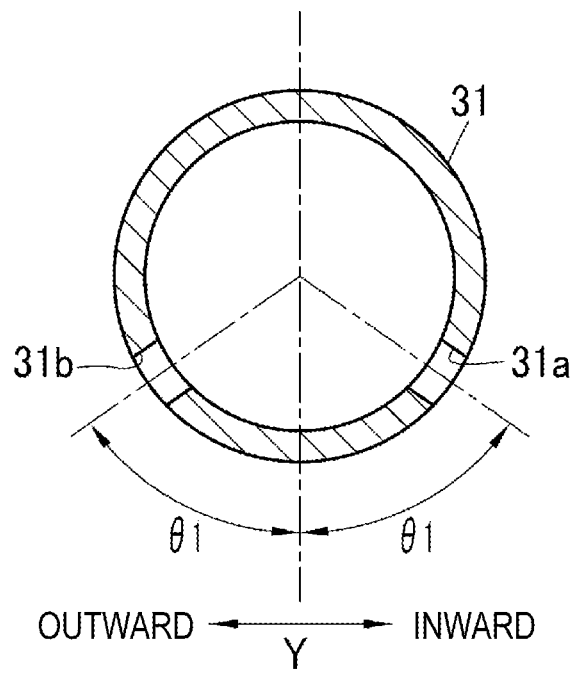
FIG. 4 A cross-sectional view that illustrates a liquid discharge hole formed in a liquid supply pipe.

As illustrated in FIG. 4, the liquid discharge holes 31*a* are formed so as to penetrate the pipe wall portion of the liquid supply pipe 31 downward inward, and the liquid discharge holes 31*b* are formed so as to penetrate the pipe wall portion of the liquid supply pipes 31 downward outward. Accordingly, the liquid discharge holes 31*a* discharge the processing liquid 12 downward inward, and the liquid discharge holes 31*b* discharge the processing liquid downward outward. Here, in the width direction, a direction toward the widthwise center is an inward direction, and a direction opposite toward the widthwise center is an outward direction. In addition, the discharge direction being downward inward means having a downward component and an inward component, and the discharge direction being downward outward means having a downward component and an outward component.

An inclination angle θ1 (an angle of axial center of liquid discharge holes 31*a* and 31*b* with respect to vertical downward direction) of the liquid discharge holes 31*a* and 31*b* can be appropriately determined. In this example, the liquid discharge holes 31*a* and 31*b* are formed such that their axial centers coincide with radial direction of the liquid supply pipes 31, and the inclination angle θ1 is set to 50°. Additionally, the diameters of the liquid discharge holes 31*a* and 31*b* are the same, but the present invention is not limited thereto.

Figure 5:
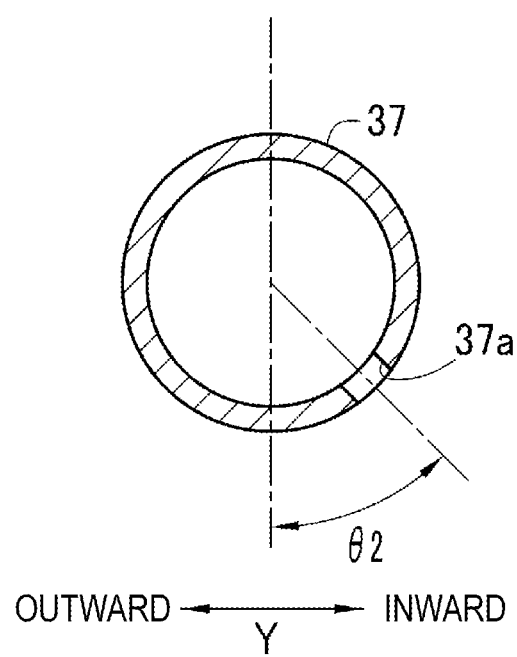
FIG. 5 A cross-sectional view that illustrates a gas discharge hole formed in a bubble pipe.

As illustrated in FIG. 5, the gas discharge holes 37*a* are formed so as to penetrate the pipe wall portion of the bubble pipes 37 downward inward. Accordingly, the gas discharge holes 37*a* discharge the nitrogen gas obliquely downward with an inward component, that is, downward inward. An inclination angle θ2 of the gas discharge holes 37*a* can be appropriately determined. In this example, the gas discharge holes 37*a* are formed such that its axial center coincides with the radial direction of bubble pipe 37, and the inclination angle θ2 of the gas discharge holes 37*a* is set to 45°. The configuration in which the gas discharge holes 37*a* face downward as described above has an advantage that the processing liquid 12 is less likely to enter the bubble pipes 37 through the gas discharge holes 37*a*, and the processing liquid 12 is likely to drain even when the processing liquid 12 enters the bubble pipe 37. Additionally, the diameters of the gas discharge holes 37*a* are the same, but the present invention is not limited thereto.

Figure 6:
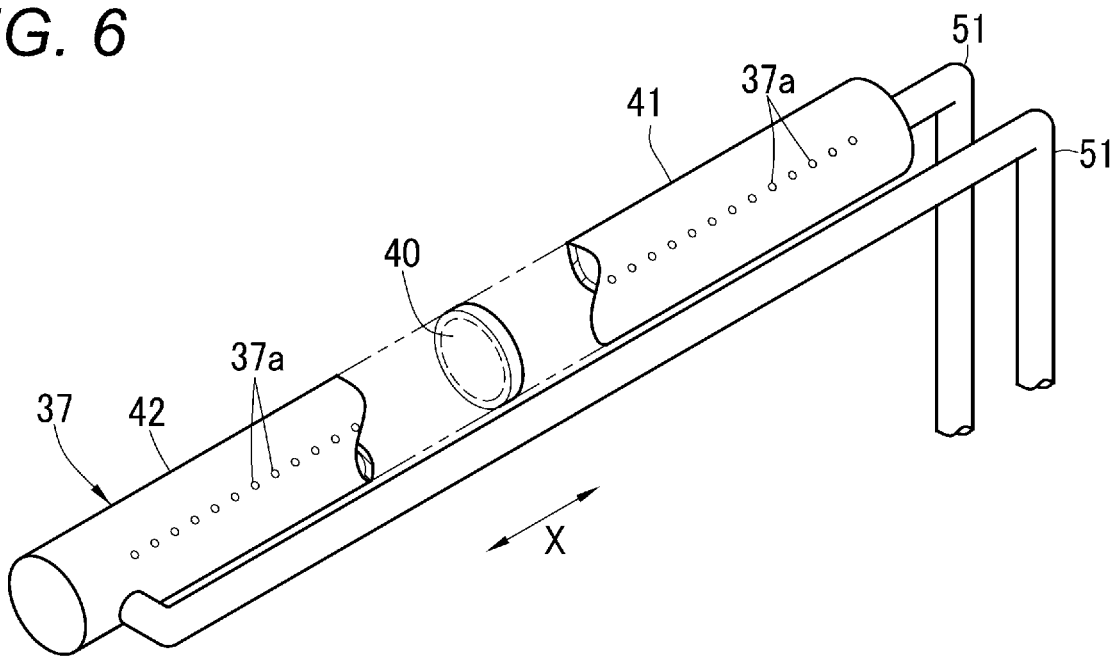
FIG. 6 A perspective view that illustrates an example of a structure of a bubble pipe.

FIG. 6 illustrates a state in which the bubble pipes 37 used in this example are viewed from below. In the bubble pipe 37 in this example, respective one end of the first discharge units 41 and second discharge units 42 that are straight tubular are joined with the partition plate 40 interposed therebetween. One end of the supply pipe 51 having a diameter smaller than that of the bubble pipes 37 is connected to the end surface of the base end of the first discharge unit 41. The supply pipe 51 connected to the first discharge unit 41 is bent in an L-shape and has the other end side extending upward. One end of the supply pipe 51 having a diameter smaller than that of the bubble pipes 37 is connected to the pipe wall on the base end side of the one second discharge unit 42. The supply pipe 51 connected to the second discharge unit 42 has a shape in which one end side is bent in the L-shape, a central portion is disposed along the bubble pipes 37, and the other end side extends upward. Additionally, the bubble pipes 37 may have a structure in which the partition plate 40 is provided in one straight pipe, or a structure in which the first discharge units 41 and the second discharge units 42 are coaxially arranged without being integrated.

Figure 7:
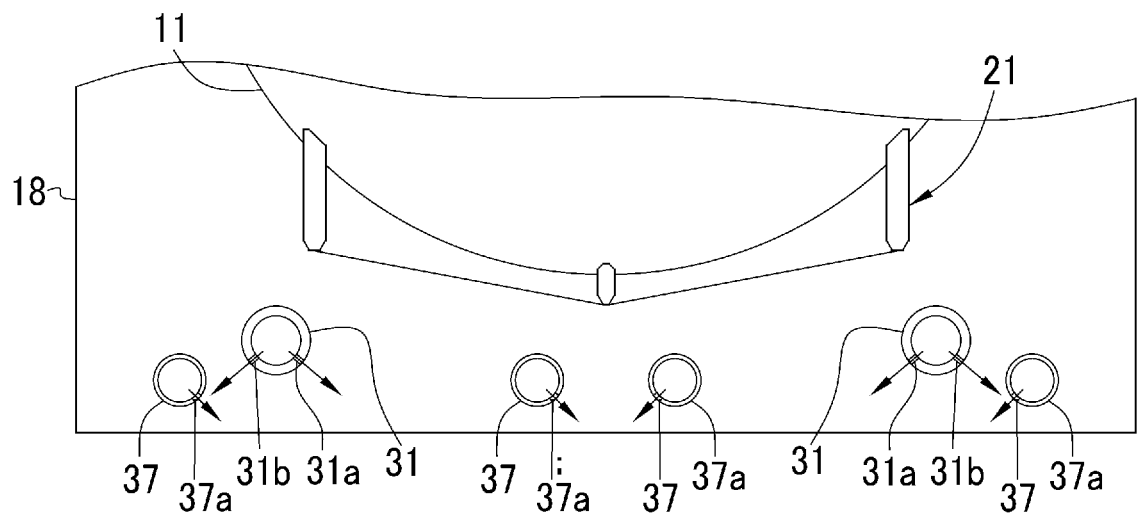
FIG. 7 An explanatory view that illustrates discharge directions of a processing liquid and nitrogen gas from a liquid supply pipe and a bubble pipe.

The arrangement of the liquid supply pipes 31 and the bubble pipes 37 as viewed from the substrate arrangement direction, and the discharge directions of the processing liquid 12 and the nitrogen gas are illustrated in FIG. 7. As described above, the liquid supply pipe 31 is disposed immediately below the vicinity of the end portion of the substrates 11 in the width direction, discharges the processing liquid 12 downward inward from the liquid discharge holes 31a, and discharges the processing liquid 12 downward outward from the liquid discharge holes 31b. On the other hand, the bubble pipes 37 are disposed at the center portion and on both sides in the width direction, respectively, and all of them discharge the nitrogen gas downward inward from the gas discharge holes 37a.

The processing liquid 12 from each of the liquid discharge holes 31a is discharged downward inward to turn into a rising flow while spreading in the width direction from a bottom surface of the processing tank 18. In the vicinity of the widthwise center of the processing tank 18, the flows spreading in the width direction of the processing liquid 12 from the pair of liquid discharge holes 31a merge, so that a relatively strong flow that is rising is formed and a flow passing through the central portion in the width direction of the substrates 11 and directed upward is generated. On the other hand, the processing liquid 12 from each liquid discharge hole 31b is discharged downward outward to turn into a flow rising from the bottom surface of the processing tank 18, and forms an upward flow passing through the end portion in the width direction of the substrates 11 while outward expansion is regulated by side wall surface of the processing tank 18.

The gas discharge holes 37a of the bubble pipes 37 discharge the nitrogen gas downward inward as described above. Further, each bubble pipe 37 is disposed at a position lower than the liquid supply pipes 31, and more specifically, the position of the gas discharge holes 37a of the bubble pipes 37 is lower than the positions of the liquid discharge holes 31a and 31b of the liquid supply pipes 31.

By providing a downward component in each of the discharge directions of the processing liquid 12 and the nitrogen gas by the liquid discharge holes 31a and 31b and the gas discharge holes 37a, the bubbles of nitrogen gas can be effectively contained in the processing liquid 12 discharged from the liquid discharge holes 31a and 31b in the vicinity of the bottom surface of the processing tank 18. Accordingly, the rising flow of the processing liquid 12 as described above is promoted by the bubbles of nitrogen gas to effectively enter between the adjacent substrates 11 and between the support plates 44 and the substrates 11. In addition, by the processing liquid 12 containing the bubbles of nitrogen gas, a slag-like flow of the processing liquid 12 is formed between the adjacent substrates 11 and between the support plates 44 and the substrates 11, and the rising flow of the processing liquid 12 is promoted. The fluidity of the processing liquid 12 is enhanced by mixing the bubbles of nitrogen gas into the processing liquid 12. Further, when the bubbles are formed in the processing liquid 12, the bubbles push up the upper processing liquid 12 and draw in the lower processing liquid 12 when the bubbles rise due to buoyancy. Therefore, the rising flow of the processing liquid 12 and the stirring of the processing liquid 12 are promoted by the bubbles.

By providing an inward component in the discharge direction of the inner bubble pipe 37, a large amount of bubbles of nitrogen gas can be contained in the processing liquid 12 in the vicinity of the widthwise center where the flow tends to be particularly poor, and the flow of the processing liquid 12 upward through the central portion in the width direction of the substrates 11 can be effectively promoted. Further, by setting the discharge direction of the nitrogen gas from the outer bubble pipe 37 disposed close to the outside of the liquid supply pipes 31 to be downward inward, the processing liquid 12 discharged downward outward from the liquid supply pipe 31 flows so as to take in the nitrogen gas discharged from the outer bubble pipe 37, so that the nitrogen gas can be easily taken in a highly viscous processing liquid 12 to form the bubbles. Since the gas discharge holes 37a of the outer bubble pipe 37 is below the liquid discharge holes 37b, the nitrogen gas can be more effectively taken in to the processing liquid 12. Accordingly, the upward flow mainly passing through the end portion of the substrates 11 in the width direction is effectively promoted.

Further, by providing the liquid discharge holes 31a and 31b with a downward component, it is possible to reliably prevent the processing liquid 12 from hitting a specific portion of the substrates 11, and it is possible to effectively suppress a local increase in the etching rate and generation of foreign matters in an in-plane direction of the substrates 11 from a bevel portion.

Figure 8:
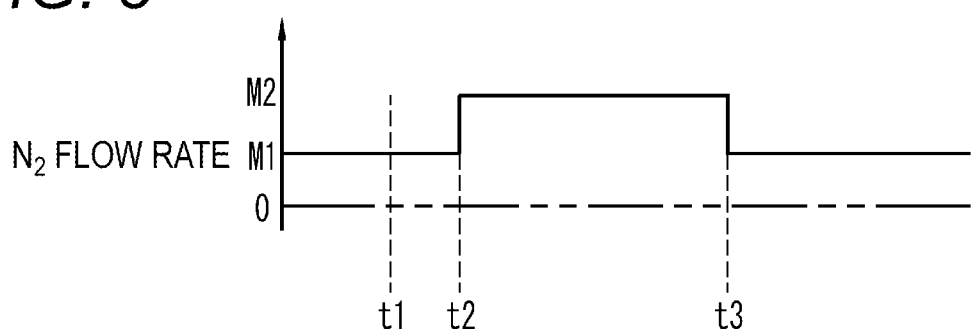
FIG. 8 A timing chart that illustrates a change in a flow rate of nitrogen gas to a bubble pipe.

Next, the operation of the above configuration will be described. As illustrated in FIG. 8, even during an idle period before time t1 at which the substrates 11 are not immersed in the processing liquid 12 in the processing tank 18, the nitrogen gas from the gas supply section 35 is supplied to the first discharge unit 41 and the second discharge unit 42 of each of the bubble pipes 37. A flow rate M1 of the nitrogen gas in the idle period is smaller than that in the etching period. Accordingly, this prevents the processing liquid 12 from entering the first discharge units 41 and the second discharge units 42 through the gas discharge holes 37a. Additionally, the flow rate M1 of the nitrogen gas to the first discharge unit 41 and the second discharge unit 42 of each bubble pipe 37 in the idle period may not be individually adjusted.

On the other hand, the processing liquid 12 is continuously supplied to the processing tank 18 through each liquid discharge hole 31a of the liquid supply pipes 31 by the circulation mechanism 15. The processing liquid 12 each discharged downward inward and downward outward from the liquid discharge holes 31a turns into a flow rising on the bottom surface of the processing tank 18 to flow toward the upper portion of the processing tank 18 while spreading in the width direction. Even in this idle period, the bubbles of nitrogen gas are formed in the processing liquid 12 in a small amount.

The substrates 11 from which the silicon nitride film is to be removed are immersed in the processing liquid 12 within the processing tank 18 as the holder 21 moves to the lowered position while being held by the holder 21 (time t1). When the substrates 11 are immersed in the processing liquid 12, the nitrogen gas is supplied to the first discharge unit 41 and the second discharge unit 42 of each bubble pipe 37 at a normal flow rate M2 after waiting for temperature recovery of the processing liquid 12 (time t2). At this time, since the nitrogen gas is supplied to each of the first discharge unit 41 and the second discharge unit 42 of each bubble pipe 37 at a flow rate adjusted in advance by the corresponding flow rate adjustment unit 52, the flow rate M2 is a value corresponding to each of the first discharge units 41 and each of the second discharge units 42.

The first discharge unit 41 and the second discharge unit 42 discharge the nitrogen gas from the gas discharge holes 37a at flow rates corresponding to the flow rates respectively supplied, thereby forming the bubbles of nitrogen gas in the processing liquid 12. The processing liquid 12 rises and flows so as to enter between the substrates 11 and between the substrates 11 and the support plates 44 and further rises along the surface of the substrates 11 due to the flow of the processing liquid 12 and the buoyancy of the bubbles of nitrogen gas as described above. Further, at this time, the processing liquid 12 contains the bubbles of nitrogen gas, so that the fluidity is increased. In this way, the flow of the processing liquid 12 between the substrates 11 and between the substrates 11 and the support plates 44 is promoted by the bubbles, but the degree of the promotion changes according to the amount of bubbles of nitrogen gas in the processing liquid 12.

At time t3 when a predetermined processing time has elapsed since the substrates 11 were immersed in the processing liquid 12, the holder 21 moves from the lowered position to the raised position. Accordingly, the substrates 11 are pulled up from the processing liquid 12, the etching processing is finished, and the idle period is set again. Additionally, at time t3, the flow rate of the nitrogen gas to the first discharge unit 41 and the second discharge unit 42 of each bubble pipe 37 is reduced to the flow rate M1 during the idle period.

By the way, even when the bubbles of nitrogen gas are uniformly formed in the processing liquid 12 during etching processing period as described above, the uniform etching may not be obtained due to various factors. However, in the substrate processing apparatus 10 of this example, during the etching processing period, the nitrogen gas at the flow rate set in each flow rate adjustment unit 52 is supplied to each of the first discharge units 41 and the second discharge units 42 of each bubble pipe 37 as described above, and the amount of bubbles in six regions obtained by approximately dividing the space in the range of the substrates 11 held by the holder 21 is independently adjusted. In other words, the flow of the processing liquid 12 along the surface of each substrate 11 is adjusted such that there is no difference in the etching rate between the respective portions of the substrates 11 and between the respective substrates 11 approximately in each region. Accordingly, etching uniformity is improved between the respective portions of the respective substrates 11 and between the respective substrates 11 held by the holder 21.

Figure 9:
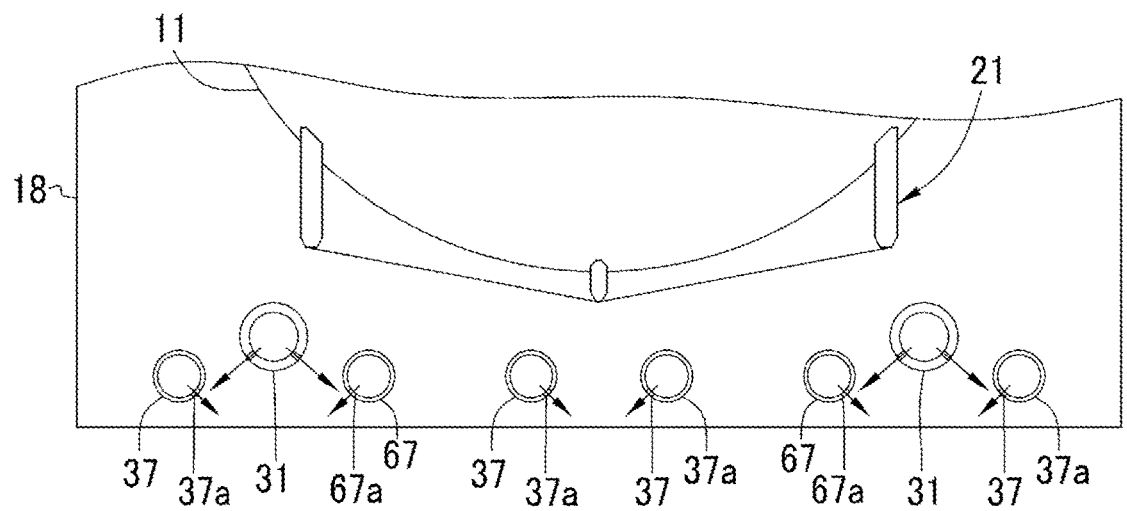
FIG. 9 An explanatory view that illustrates an example of a substrate processing apparatus provided with six bubble pipes.

In the above embodiment, four bubble pipes are provided, but the number of bubble pipes is not particularly limited as long as a plurality of bubble pipes are provided. For example, FIG. 9 illustrates an example in which six bubble pipes 37 and 67 are provided, and the bubble pipes 67 close to the liquid supply pipes 31 are further provided inside each liquid supply pipe 31. The bubble pipes 67 are provided with gas discharge holes 67a through which the nitrogen gas is directed downward outward. Other configurations are the same as those of the substrate processing apparatus 10 described above. In other words, the bubble pipes 37 disposed close to the outside of the liquid supply pipes 31 discharge the nitrogen gas downward inward, and the bubble pipes 67 disposed close to the inside discharge the nitrogen gas downward outward. As a result, the nitrogen gas discharged downward inward from the bubble pipes 37 is effectively mixed with the processing liquid 12 discharged downward outward from the liquid supply pipes 31, and the nitrogen gas discharged downward outward from the bubble pipes 67 is effectively mixed with the processing liquid 12 discharged downward inward from the liquid supply pipes 31. By increasing the bubble pipes in this manner, the space in the range of the substrates 11 held by the holder 21 can be more finely divided to independently adjust the amount of bubbles.

Although an example of the phosphoric acid aqueous solution is described above as the processing liquid, the processing liquid is not limited and is particularly useful for the highly viscous processing liquid. Examples of highly viscous processing liquid include a sulfuric acid hydrogen peroxide mixture (SPM) which is a mixed solution of sulfuric acid and hydrogen peroxide water.

In addition, when the bubbles are formed in the processing liquid, as described above, since the rising flow of the processing liquid due to the bubbles and the stirring of the processing liquid are promoted, temperature uniformity of the processing liquid between the surfaces of the respective substrates and between the respective substrates is improved. Therefore, examples of such a processing liquid that is particularly useful even for a processing liquid having a large influence of temperature on processing of a substrate include an alkaline processing liquid such as SC1 (a mixed aqueous solution of $NH_4OH$ and $H_2O_2$).

In the substrate processing apparatus 10 illustrated in FIG. 1, the flow rate of the nitrogen gas to the first discharge unit 41 and the second discharge unit 42 of each bubble pipe 37 is adjusted and supplied, the bubbles of nitrogen gas are formed in the processing liquid 12, and the result of measuring the degree of variation in etching when the substrates 11 are etched is illustrated in Table 1.

Figure 10:
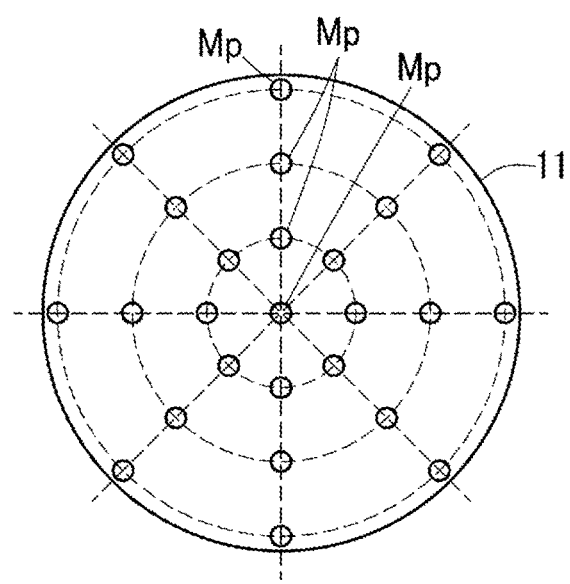
FIG. 10 An explanatory view that illustrates measurement points on a substrate at which an etching amount has been measured.

In this measurement, the first, second, third, . . . , and the fiftieth substrates 11 were set in order from the leading end side of the liquid supply pipes 31, and the etching amounts at 25 measurement points were measured for each of the first, the twenty-fifth, and the fiftieth substrates 11, to obtain in-plane variations and in-batch variation. As illustrated in FIG. 10, measurement points Mp are about 1/3, 2/3, and 3/3 of the radius of the substrates 11 from the center of the substrates 11 and the center on each line in the radial direction set at intervals of 45° in a circumferential direction. The in-plane variations of the substrates 11 were obtained as "etching variation (%)=(maximum etching amount−minimum etching amount)/(2×average etching amount)×100%" using the etching amount measured at 25 points. The variation in the batch were obtained by the same formula as the in-plane variations, using the etching amounts at each 25 places of three substrates 11, that is, 75 places in total.

Additionally, the diameter of the substrates 11 was 300 mm, the arrangement pitch of the substrates 11 was 5 mm, the processing liquid temperature was 163° C., and the etching time was 600 sec.

TABLE 1

|  |  | Etching variation |
|---|---|---|
| In-plane of substrate | First substrate | 2.00% |
|  | Twenty-fifth substrate | 2.20% |
|  | Fiftieth substrate | 1.60% |
| In batch |  | 2.20% |

As can be seen from Table 1, the in-plane variations and the in-batch variation are small by forming bubbles of nitrogen gas in the processing liquid 12. Accordingly, this shows that the in-plane variations and the in-batch variation are improved.

REFERENCE SIGNS LIST

10: Substrate processing apparatus
11: Substrate
12: Processing liquid
31: Liquid supply pipe
31a, 31b: Liquid discharge hole
35: Gas supply section
37: Bubble pipe
37a: Gas discharge hole
41: First discharge unit
42: Second discharge unit
52: Flow rate adjustment unit

The invention claimed is:

1. A substrate processing apparatus comprising:
a processing tank that stores a processing liquid and accommodates a plurality of substrates arranged at a predetermined pitch in a standing state;
a bubble forming section that includes a plurality of bubble pipes, wherein each of the plurality of bubble pipes is divided into a tubular first discharge unit that extends in an arrangement direction of the plurality of substrates and a tubular second discharge unit that is coaxial with the first discharge unit and extends in the arrangement direction within an arrangement range where the plurality of substrates are arranged, wherein one end on a divided side of the first discharge unit and one end on the divided side of the second discharge unit is closed and a plurality of gas discharge holes are formed on the first discharge unit and the second discharge unit along the arrangement direction, and the plurality of bubble pipes are disposed at an interval in a horizontal direction orthogonal to the arrangement direction below the plurality of substrates to be accommodated in the processing tank;
a liquid supply pipe portion that includes a plurality of liquid supply pipes, wherein a plurality of liquid discharge holes that discharge the processing liquid are formed on the plurality of liquid supply pipes along the arrangement direction, and the plurality of liquid supply pipes are disposed at an interval in the horizontal direction below the plurality of substrates to be accommodated and are disposed inside with respect to the plurality of bubble pipes in the processing tank; and
a plurality of flow rate adjustment units that are provided corresponding to each of the first discharge units and each of the second discharge units and independently adjust flow rate of an inert gas with respect to the corresponding first discharge units or second discharge units.

2. The substrate processing apparatus according to claim 1, wherein the plurality of gas discharge holes of the first discharge unit and the second discharge unit discharge the inert gas downward inward.

3. A substrate processing apparatus comprising:
a processing tank that stores a processing liquid and accommodates a plurality of substrates arranged at a predetermined pitch in a standing state;
a liquid supply pipe that is disposed below the plurality of substrates to be accommodated in the processing tank and has a plurality of liquid discharge holes that are formed in an arrangement direction of the plurality of substrates and discharge the processing liquid downward inward and downward outward; and
a bubble pipe that is disposed below the plurality of substrates to be accommodated in the processing tank and has a plurality of gas discharge holes that are formed in the arrangement direction and discharge an inert gas obliquely downward to form bubbles of the inert gas in the processing liquid, wherein
the bubble pipe is disposed close to the outside with respect to the liquid supply pipe, and discharges the inert gas downward inward.

4. The substrate processing apparatus according to claim 3, wherein the plurality of gas discharge holes are arranged at positions lower than the plurality of liquid discharge holes.

* * * * *